March 11, 1969 N. H. KATZ ETAL 3,432,365

COMPOSITE THERMOELECTRIC ASSEMBLY HAVING PREFORMED INTERMEDIATE LAYERS OF GRADED COMPOSITION

Filed Feb. 7, 1963

INVENTORS
NORMAN H. KATZ
MARTIN H. BINSTOCK
BY Gerald A. Koris
ATTORNEY

United States Patent Office 3,432,365
Patented Mar. 11, 1969

3,432,365

COMPOSITE THERMOELECTRIC ASSEMBLY HAVING PREFORMED INTERMEDIATE LAYERS OF GRADED COMPOSITION

Norman H. Katz, Northridge, and Martin H. Binstock, Tarzana, Calif., assignors to North American Rockwell Corporation, a corporation of Delaware Filed Feb. 7, 1963, Ser. No. 256,877
U.S. Cl. 136—237 2 Claims
Int. Cl. H01v 1/18

Figure 1:
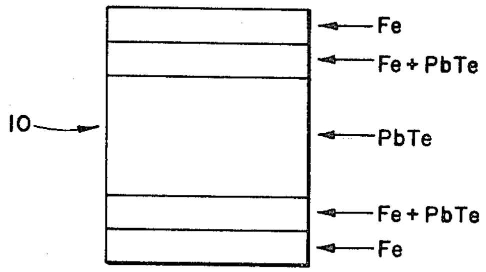

Our invention relates to an improved composite thermoelectric assembly, and more particularly to a method of joining thermoelectric elements to a heat source and a heat sink which provides an assembly of compatible physical properties.

There is considerable interest in the use of thermoelectric devices for converting heat directly to electrical energy without conventional rotating machinery, particularly for remote and space applications. Thermoelectric materials are well known to the art and include such materials as germanium-silicon, zinc-antimony, copper-silver-selenium, bismuth telluride, lead telluride, germanium-bismuth telluride, tin telluride, manganese telluride, lead sulfide, and Chromel-constantan. A thermoelectric converter assembly customarily consists of the thermoelectric material, alternately doped with p-type and n-type dopants in the case of semi-conductors, with electrical contacts joined thereto. One side of the element is connected to a hot junction which serves as a heat source, and the other side to a cold junction such as a radiator which serves as a heat sink. The impressed temperature differential across the element generates an E.M.F., in accordance with the Seebeck effect.

Certain of the properties of semi-conductor materials are particularly attractive for use in thermoelectric converter modules. The semi-conductors generally have a relatively low thermal conductivity, which gives a high temperature differential between hot and cold junctions. The electrical resistivity can be low enough to permit high current flows with low potential. The materials are readily doped to form negative (n) and positive (p) materials. By arranging positive and negative elements in couples, and connecting the couples in series, the voltages can be increased to useful values.

There are, however, certain undesirable properties of the semi-conductor materials, especially from the standpoint of fabrication into useful shapes. These include very low tensile and compressive strengths, and a very high thermal expansion coefficient. Such properties, together with low thermal conductivity, make the materials very susceptible to rupture from mechanical and thermal shock, particularly during temperature cycling.

The difficulties arising from the physical nature of the semi-conductor material itself are compounded when it is used in association with metallic structural materials in a converter assembly. The heat sources for thermoelectric assemblies, particularly those using liquid metals, are contained in such metals as stainless steels, and high alloy content chromium, nickel, and cobalt-base alloys. Heat sinks are generally made of metals with good thermal conductivity, such as aluminum or copper. The thermoelectric materials tend to form low melting eutectics with such metals, especially at elevated temperatures, with the result that the thermoelectric properties are degraded. Further degradation in properties results from the effects of thermal shock and tensile and shear forces on the semiconductor material in contact with metals of good thermal conductivity and low thermal expansion coefficients, the opposite thermal characteristics of the semi-conductors.

In order to utilize the thermoelectric materials in devices having such disparate materials characteristics, it is necessary to bond the thermoelectric elements to the heat source and the heat sink with intermediate contacts. Such contacts must have low electrical resistance compared with the thermoelectric material, high thermal conductivity, and must not react with the thermoelectric material to poison it, form low melting eutectics in the opening ranges, or otherwise degrade the properties of the thermoelectric material. Satisfactory contact materials include iron, manganese, cast iron, ferritic steels, molybdenum, tungsten, and columbium. While these materials do not react with particular thermoelectric materials, they nonetheless have significantly different thermal expansion coefficients than the semi-conductors, and problems of thermal shock are therefore still serious.

An object of the present invention is to provide an improved composite thermoelectric assembly for a thermoelectric converter.

Another object is to provide such an assembly which does not cause degradation of the properties of the thermoelectric material, and which can withstand relatively severe thermal shock or cycling.

Another object is to provide such an assembly for contacting a thermoelectric material with hot and cold junctions, wherein good mechanical bonding is obtained between contacts and thermoelectric materials.

Still another object is to provide a contact between thermoelectric material and structural members in a thermoelectric assembly in which the Seebeck voltages approach theoretical limits for both n- and p-type elements.

Another object is to provide such a contact in which electrical resistivity of the elements is not detrimentally altered by thermal cycling.

Another object of the present invention is to provide an improved method of forming a composite thermoelectric assembly for use in a thermoelectric device.

A further object is to provide such a method wherein good mechanical bonding between contact and thermoelectric materials is achieved, and contacts with gradually changing thermal coefficients of expansion are obtained.

A further object is to provide such a method wherein the Seebeck voltages of the composite assembly approach theoretical values and electrical resistivity is not materially increased during operation.

A still further object is to provide such a process in which different shapes can be fabricated with relative ease, and which is capable of high production rates.

The foregoing and other objects and advantages of our invention will become apparent from the folowing detailed description.

Figure 2:
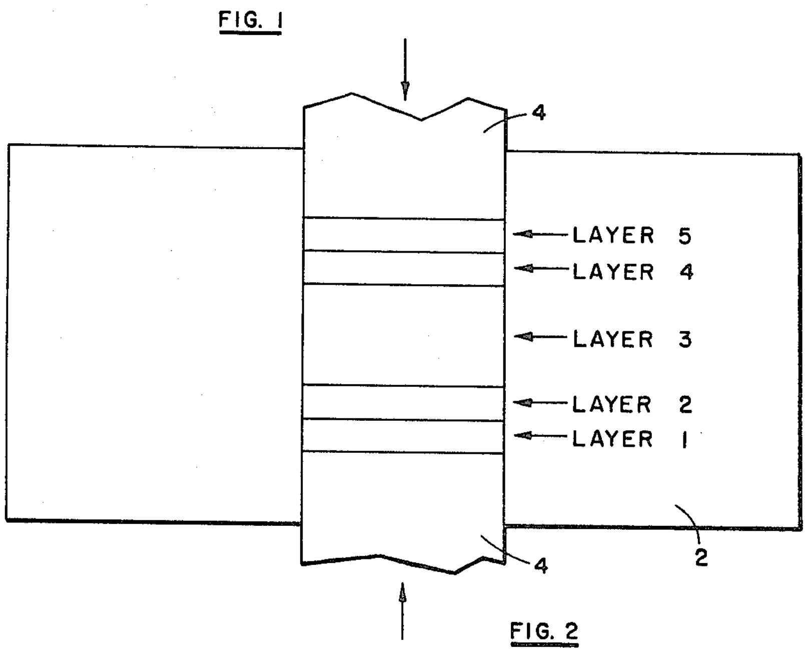
Figure 3:
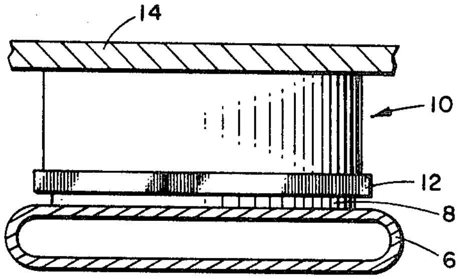

In the drawings, FIG. 1 is a schematic representation of a composite article of the thermoelectric and contact materials;

FIG. 2 is a schematic view showing an arrangement of the thermoelectric and contact materials in a die; and FIG. 3 is an end elevation, partially sectionalized, of a typical thermoelectric assembly showing the relationship of the thermoelectric material to the heat source and heat sink and the contact therebetween.

In accordance with the present invention, we have provided a thermoelectric assembly which comprises a sandwich structure having a central layer of a thermoelectric material, outer layers of a contact metal, and thereinbetween layers of a mixture of thermoelectric and contact materials. In this manner, a composite thermoelectric assembly is produced having contacts with a gradually changing thermal coefficient of expansion ranging from the α of the pure thermoelectric material to the α of the pure contact material. Good mechanical bonding is obtained between contact and thermoelectric materials, and the element can withstand relatively severe thermal shock or cycling. Of major importance, the electrical properties are not adversely affected; the Seebeck voltages approach theoretical limits, and electrical resistivity of the elements is not detrimentally altered after thermal cycling. There is no eutectic formation with structural members of a thermoelectric assembly, and consequently no poisoning of the thermoelectric material.

The structure of the composite thermoelectric assembly 10 is seen in FIG. 1. The pure semi-conductor material, for example PbTe, is the middle layer and the outer layers are of the pure contact metal, for example Fe. The intermediate layers therebetween are of Fe+PbTe. The intermediate layer may be a single layer of a specific composition, for example, satisfactory results are obtained with a 50/50 mixture. The intermediate layer may also be of a graded, varying composition, and comprise a plurality of separate layers, the layer closest to the PbTe being PbTe-rich and the layer closest to the iron contact being iron-rich. For example, the section adjacent the pure PbTe may contain 90 PbTe and 10 Fe, and the layer closest to the pure Fe contact may then comprise 90 Fe and 10 PbTe. Thus, the composition of the intermediate layer may vary in composition from about 10–100 weight percent contact metal to about 100–10 weight percent thermoelectric material.

The assembly shown in FIG. 1 can be made in various ways, for example by hot and cold pressing; we find that powder metallurgy fabrication by cold pressing is preferred. The following detailed description of cold pressing fabrication will be given, for convenience in presentation, with respect to the cold pressing of PbTe and Fe. The thermoelectric material is first crushed to form a powder. The thermoelectric material may have predetermined quantities of additives to act as negative or positive promoters capable of producing a desired Seebeck coefficient, or these may be added to the powder. Example of additives to PbTe are 0.05 mole percent $PbI_2$ to give an n-type element, and 1.0 atom percent Na to give a p-type element. The contacts are prepared from high purity iron powder, for example from electrolytic Fe, and the Fe is mixed with varying amounts of PbTe.

As seen with reference to FIG. 2, a given weight percent of pure contact material (Fe powder) is added to a die cavity 2 and leveled by tamping and/or vibration to form a uniformly thick layer, designated as Layer 1. A given weight percentage of Fe+PbTe powder is homogeneously mixed and added to the same die cavity above Layer 1 and leveled to form Layer 2. As indicated previously, this layer may be of a single composition mixture or may comprise a plurality of separate layers to give a graded composition, iron-rich on the Fe side, PbTe-rich on the PbTe side, and of about the same weight ratio in the middle. A given weight percent of pure PbTe powder, appropriately doped, is added to the die cavity above Layer 2 and leveled to form Layer 3. This constitutes the main body of the thermoelectric element. A given weight percent of Fe+PbTe powder is homogeneously mixed to give a composition similar to Layer 2, and is added to the die cavity above Layer 3 and leveled to form Layer 4. Finally, pure Fe powder is again added to the die cavity above Layer 4 and leveled to form Layer 5. The assembly is then compacted by means of steel rams 4.

The entire composite consisting of five distinct layers is then cold pressed, at pressures of about 20 to 80 t.s.i. A pressure of about 30 t.s.i. is found to be very satisfactory. Cold pressing is ordinarily accomplished very rapidly, for example in a few seconds. After being ejected from the die, the compact is sintered in a reducing atmosphere, for example in a hydrogen atmosphere at a temperature of about 1000° to 1500° F. for approximately 3 to 10 hours; a temperature of about 1300° F. for approximately 4 hours being highly satisfactory. The resulting laminated element consists of a central main body of thermoelectric material bonded on both ends to a solid mixture of Fe+PbTe which in turn is bonded to solid Fe.

A suitable modification of the above cold pressing method is to cold press each layer individually at a relatively low pressure, for example in the order of 5 t.s.i. The layers are then assembled in the same arrangement as in FIG. 2 for compaction at pressures in the order of 50 t.s.i., following which sintering is performed in the previous manner.

The composite assemblies prepared in the above manner may be joined to structural members in a thermoelectric assembly, such as the heat source, radiator, and electrical conductor strap, by known means including pressure bonding and brazing. Satisfactory brazes include such compositions as 61.5% Ag–24.0% Cu–14.5% In and 72.0% Ag–28% Cu. The assemblies may also be encapsulated to prevent sublimation at elevated temperatures by methods available to the art, which include the application of ceramic and glass encapsulants.

Compositions prepared according to the present invention not only better match thermal coefficients of expansion of semi-conductor and structural members, and consequently are less subject to thermal shock during temperature cycling, but also have excellent thermoelectric characteristics. The Seebeck voltages approach theoretical limits for both n- and p-type elements at all temperatures up to at least about 1100° F. Some typical values are given in Table I below for a composite assembly in a 5-layer arrangement as in FIG. 1, having the dimensions ¾" square x ¼" thick. The semi-conductor material was PbTe, the contact metal iron, and the intermediate layers 50 weight percent Fe–50 weight percent PbTe. The n material was doped with 0.05 mole percent $PbI_2$ and the p material with 1.0 atomic percent Na. The powder assembly was cold pressed at 50 t.s.i. and then sintered in hydrogen at 1100° F. for 8 hours.

TABLE I

| | Seebeck Coefficient (Microvolts/° F.) | | | | | |
|---|---|---|---|---|---|---|
| | Max. Temp. (° F.)ZT=20° F. | | | | | |
| | 100° | 200° | 400° | 600° | 800° | 1,000° |
| Thermoelectric Element: | | | | | | |
| n | 50 | 63 | 87 | 105 | 130 | 130 |
| p | 35 | 60 | 97 | 135 | 160 | 138 |

Further, the resistivity of the elements is not detrimentally altered after a plurality of thermal cycles. Table II presents data showing the effects on resistivity of cycling from 70° F. to 1000° F. to 70° F. in 10 minutes for 10 cycles.

TABLE II.—RESISTIVITY (micro ohm-in.)

| | Before | After |
|---|---|---|
| Element: | | |
| n | 120 | 140 |
| p | 222 | 251 |

The following data was taken on thermoelectric production elements for a thermoelectric pump. The elements were of the same composition as those tested above and were prepared by cold pressing at 30 t.s.i. and sintered at 1300° F. for 4 hours in hydrogen. The elements had dimensions of 3" x 1" x ¼" thick. The indicated voltage and resistance measurements were taken at the indicated temperatures at the indicated junctions under the indicated compression loads. The thermoelectric material is customarily kept under compression during operation, since the mechanical properties of thermoelectric materials are found to be better under compression.

TABLE III.—THERMOELECTRIC CHARACTERISTICS

| High Temp., Res. MΩ | Cold Junction Temp., mv. | Hot Junction Temp., mv. | Seebeck E.M.F., mv. | Cold Junction Temp., ° F. | Hot Junction Temp., ° F. | Δ T Temp., ° F. | E.M.F. (Mv) per ° F. | P.s.i. |
|---|---|---|---|---|---|---|---|---|
| p-Type Material: | | | | | | | | |
| 10 | 1.03 | 1.03 | 0 | 78 | 78 | 0 | 0 | 50 |
| 11 | 3.16 | 6.09 | 5.50 | 170 | 300 | 130 | 42.3 | 80 |
| 15 | 4.14 | 9.00 | 11.74 | 210 | 430 | 220 | 53.4 | 100 |
| 19 | 5.09 | 11.04 | 17.65 | 255 | 520 | 265 | 66.6 | 105 |
| 23 | 5.86 | 12.40 | 22.00 | 290 | 580 | 290 | 76.0 | 110 |
| 31 | 6.92 | 14.02 | 26.56 | 340 | 650 | 310 | 85.8 | 115 |
| 36 | 8.12 | 15.18 | 29.50 | 390 | 700 | 310 | 95.8 | 120 |
| 39 | 9.26 | 16.35 | 32.33 | 440 | 750 | 310 | 104.2 | 125 |
| 49 | 10.50 | 17.53 | 33.70 | 500 | 800 | 300 | 112.4 | 130 |
| 56 | 11.71 | 18.70 | 36.05 | 550 | 850 | 300 | 120.0 | 135 |
| 60 | 12.86 | 19.89 | 38.02 | 600 | 900 | 300 | 126.8 | 138 |
| 64 | 14.02 | 21.07 | 39.16 | 650 | 950 | 300 | 130.05 | 140 |
| n-Type Material: | | | | | | | | |
| 14 | 1.37 | 1.37 | 0 | 93 | 93 | 0 | 0 | 50 |
| 22 | 4.90 | 10.57 | 12.23 | 245 | 500 | 255 | 48.0 | 80 |
| 23 | 5.70 | 11.71 | 14.44 | 280 | 550 | 270 | 53.5 | 105 |
| 24 | 6.40 | 12.86 | 16.83 | 315 | 600 | 285 | 59.1 | 110 |
| 24 | 7.17 | 14.02 | 18.80 | 350 | 650 | 300 | 63.0 | 115 |
| 25 | 8.39 | 15.18 | 20.26 | 400 | 700 | 300 | 67.5 | 120 |
| 29 | 9.59 | 16.35 | 22.53 | 455 | 750 | 295 | 76.3 | 122 |
| 30 | 10.30 | 17.53 | 24.33 | 490 | 800 | 310 | 78.3 | 124 |
| 32 | 11.70 | 18.70 | 26.30 | 550 | 850 | 300 | 87.6 | 128 |
| 46 | 12.86 | 19.89 | 27.04 | 600 | 900 | 300 | 90.3 | 131 |
| 48 | 14.02 | 21.07 | 28.54 | 650 | 950 | 300 | 93.0 | 135 |
| 54 | 14.60 | 21.66 | 29.35 | 675 | 975 | 300 | 97.8 | 138 |

The use of a thermoelectric material-contact assembly, such as in FIG. 1, is shown in FIG. 3. FIG. 3 is a typical cross-sectional view of a portion of a thermoelectric module. Heat is applied to the assembly 10 by a fluid flowing through tube 6. The tube may be fabricated of stainless steel and the fluid may be a liquid metal such as sodium. A thermal conductor as well as electrical insulator 8 is positioned between tube 6 and conductor strap 12 to prevent electrical short circuiting of the thermoelectric element to the heat source. Strap 12 electrically connects the thermoelectric element with the next element in the module. A heat sink or radiator 14 such as of copper is bonded to the assembly 10 for heat rejection.

The foregoing examples of the invention were given for purposes of illustration, and are not intended as limiting. Variations and modifications may be made by those skilled in the art which are within the scope of our invention.

We claim:

1. A sintered composite thermoelectric assembly for a thermoelectric converter, consisting essentially of a central layer of a thermoelectric material, outer layers of a contact metal for contacting a heat source and a heat sink, and intermediate layers comprising a mixture of said contact metal and said thermoelectric material, wherein each of said intermediate layers is a distinguishable, preformed layer of graded composition, relatively rich in contact metal in the region bordering the contact metal and then graduating to a region relatively rich in thermoelectric material in the region bordering the thermoelectric material.

2. The thermoelectric assembly of claim 1 wherein said thermoelectric material is lead telluride and said contact metal is iron.

References Cited

UNITED STATES PATENTS

| | | | |
|---|---|---|---|
| 2,496,346 | 2/1950 | Haayman et al. | |
| 2,811,569 | 10/1957 | Fredrick et al. | 136—238 |
| 3,203,772 | 8/1965 | Intrater | 29—195 |
| 3,232,719 | 2/1966 | Ritchie | 29—195 |
| 3,238,614 | 3/1966 | Intrater | 29—498 |
| 3,269,871 | 8/1966 | Kilp et al. | 136—203 |
| 3,082,277 | 5/1963 | Lane et al. | 136—5 |
| 3,068,557 | 12/1962 | Kosco et al. | 75—208 |
| 2,462,906 | 3/1949 | Sauerborn | 75—208 |

FOREIGN PATENTS 369,964 3/1932 Great Britain.

OTHER REFERENCES

Horn et al.: R.C.A. Technical Note No. 304, November 1959.

ALLEN B. CURTIS, *Primary Examiner.*

U.S. Cl. X.R.

29—182.2, 573